US009607840B2

(12) United States Patent
Posseme

(10) Patent No.: US 9,607,840 B2
(45) Date of Patent: Mar. 28, 2017

(54) METHOD FOR FORMING SPACERS FOR A TRANSISTOR GATE

(71) Applicant: Commissariat A L'Energie Atomique et aux Energies Alternatives, Paris (FR)

(72) Inventor: Nicolas Posseme, Sassenage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/185,281

(22) Filed: Jun. 17, 2016

(65) Prior Publication Data
US 2016/0372331 A1 Dec. 22, 2016

(30) Foreign Application Priority Data
Jun. 19, 2015 (FR) ...................... 15 55663

(51) Int. Cl.
| H01L 21/00 | (2006.01) |
| H01L 21/28 | (2006.01) |
| H01L 29/66 | (2006.01) |
| H01L 29/78 | (2006.01) |
| H01L 29/06 | (2006.01) |
| H01L 29/49 | (2006.01) |

(52) U.S. Cl.
CPC .... *H01L 21/28123* (2013.01); *H01L 29/0649* (2013.01); *H01L 29/4983* (2013.01); *H01L 29/66651* (2013.01); *H01L 29/7838* (2013.01)

(58) Field of Classification Search
CPC ......... H01L 21/28123; H01L 29/66651; H01L 29/7838; H01L 29/0649; H01L 29/4983
See application file for complete search history.

(56) References Cited

U.S. PATENT DOCUMENTS

| 4,638,347 | A | * | 1/1987 | Iyer | ..................... H01L 29/4983 257/384 |
| 5,899,747 | A | * | 5/1999 | Wu | .................... H01L 21/31111 257/E21.251 |
| 2008/0242092 | A1 | | 10/2008 | Wei | |
| 2013/0252430 | A1 | | 9/2013 | Ranjan et al. | |
| 2014/0187046 | A1 | | 7/2014 | Posseme et al. | |

(Continued)

FOREIGN PATENT DOCUMENTS

EP 2 750 170 A1 7/2014

OTHER PUBLICATIONS

French Preliminary Search Report issued Apr. 22, 2016 in French Application 15 55683, filed on Jun. 19, 2015 (with English Translation of Categories of Cited Documents and Written Opinion).

(Continued)

*Primary Examiner* — Richard Booth
(74) *Attorney, Agent, or Firm* — Oblon, McClelland, Maier & Neustadt, L.L.P.

(57) ABSTRACT

A method for forming spacers of a gate of a transistor is provided, including forming a protective layer covering the gate; after the forming the protective layer, at least one step of forming a carbon film on the transistor; removing portions of the carbon film located on a top and on either side of the gate; modifying the protective layer on the top of the gate and on either side of the gate; and removing the modified protective layer.

20 Claims, 9 Drawing Sheets

(56) References Cited

U.S. PATENT DOCUMENTS

2014/0369115 A1   12/2014   Kim et al.
2015/0162416 A1   6/2015   Chang et al.
2015/0270163 A1   9/2015   Posseme
2016/0020152 A1   1/2016   Posseme

OTHER PUBLICATIONS

U.S. Appl. No. 14/997,347, filed Jan. 15, 2016, Nicolas Posseme.

* cited by examiner

Prior Art

METHOD FOR FORMING SPACERS FOR A TRANSISTOR GATE

TECHNICAL FIELD OF THE INVENTION

The present invention generally relates to field effect transistors (FET) used by the micro-electronics industry and more particularly the production gate spacers for transistors of the metal-oxide-semi-conductor (MOSFET) type, most often contact holes, mainly used for the production of all kinds of integrated circuits.

STATE OF THE ART

The relentless race for a reduction in the dimensions that characterizes the whole microelectronics industry could be achieved only with the constant improvement of key innovations throughout decades of development since the first integrated circuits were produced industrially in the sixties. A very important innovation which dates back to the seventies, and which is still used nowadays, consists in making the MOSFETs using a technique in which the source and drain electrodes are self-aligned on gate ones and so require no photo-etching operation for the definition thereof. Combined with the use of polycrystalline silicon gates, the gates themselves are produced first, and are used as masks during the doping of the source and drain zones of the transistors.

FIG. 1 is a cross-sectional view of an exemplary transistor 100 being produced. It contains the source and drain zones 110, generally designated source/drain zones, since they are usually perfectly symmetrical and can play both roles depending on the electric polarizations that are applied to the transistor. The gate conventionally comprises a stack of layers 120 a large part of which is still made of polycrystalline silicon 123. The source and drain zones are typically formed by ionic implantation 105 of dopants in the zones 110, with the gate 120 being used as masks as mentioned above, thereby preventing doping the MOSFET transistor zone wherein the conduction channel 130 between source and drain will be able to develop, depending on the voltages applied to the gate.

The basic technique, briefly described above, is well known to those skilled in the art as well as many alternative solutions thereof, and has been constantly enhanced in order to improve the electrical performances of the transistors while making it possible to accommodate the successive reductions in the transistor sizes required by an ever-increasing integration of a greater number of components into an integrated circuit.

A currently widely used technique consists in producing the integrated circuit from complex substrates 140 of the silicon on insulator type. The complex SOI substrate is characterized by the presence of a thin surface layer 146 of single-crystal silicon supported by a continuous layer 144 made of silicon oxide, also called buried oxide or still BOX, the acronym for <<buried oxide layer>>. The mechanical solidity and rigidity of the assembly are provided by the layer 142 composing the body of the SOI substrate, also defined as <<bulk>> so as to indicate that the starting substrate is generally made of solid silicon. Such structure is very advantageous for the production of MOSFET transistors. It more particularly enables a drastic reduction of stray capacities because of the presence of the continuous insulating layer 144. As for the invention, it should only be reminded that the single-crystal silicon surface layer 146 can be precisely controlled as regards thickness and doping. In particular, it is advantageous for the performances of the transistors that the channel 130 can be completely deprived of carriers, i.e. "fully depleted" (FD), as such state is generally referred to. This is obtained by producing transistors from SOI substrates the surface layer 146 of which is very thin which may be disadvantageous, as will be seen in the description of the invention. Such type of transistor is thus designated by the acronym FDSOI.

An improvement of the self-aligning basic technique that has been universally adopted consists in forming spacers 150 on the flanks of the gate. The spacers 150, typically made of silicon nitride (SiN), will enable in particular the implementation of a so-called "raised Source and Drain" technique. To keep low electrical resistances of access to the source and drain electrodes, in spite of the reduction in size of the transistors, the sections thereof had to be increased. This is obtained by selective epitaxy of source/drain zones 110. During such operation the initial single-crystal silicon layer 146 will be locally grown. Gate zones must be protected then to prevent growth from the polycrystalline silicon 123 of the gate. This function is ensured, among others, by the spacers. They also ensure the preservation of the gate 120 during the contacts siliconizing (not shown) which is then executed so as to reduce the series resistance of access to the electrodes of the transistor.

Forming spacers 150 is then a crucial step of forming the transistors, which now reach dimensions currently measured in nanometers (nm=$10^{-9}$ meters) and which globally have decananometric sizes. No photo-etching operation is executed for producing the spacers. They are self-aligned with the gate 120 from the deposition of a uniform silicon nitride layer 152 (SiN) which then undergoes a much anisotropic etching. Such etching of the SiN preferentially attacks the horizontal surfaces, i.e. all the surfaces which are parallel to the plane of the SOI substrate. It only, and imperfectly, leaves the vertical parts of the layer 152, those substantially perpendicular to the plane of the substrate, so as to obtain, in practice, the patterns the ideal shape of which would of course be rectangular.

With the known solutions, the reduction in size of the transistors results in the obtaining of spacers which fully ensure insulation and induce no defects in the production of transistors from SOI substrates becoming a very delicate operation. As a matter of fact, within the scope of the present invention, and as will be explained in greater details hereunder, it could be noted that several types of defects, such as the ones mentioned hereunder, occur during the etching of spacers, while using one or the other known anisotropic etching methods.

FIGS. 2a, 2b and 2c each illustrate a type of defect detected.

A so-called "dry" etching is used, which is implemented using a method generally referred to by its acronym RIE, for "reactive-ion etching". In such etching method, plasma which physically and chemically reacts with the surface of the wafer to be etched is formed in a confined enclosure, also referred to as chamber. When etching a silicon nitride layer, which is the preferred material for producing spacers, as mentioned above, the reactive gas is typically methyl fluoride (CH3F) which reacts with the material to be etched after introducing dioxygen (O2). Fluorine chemistry-based etching plasma is thus formed and is often designated by its constituents: CH3F/O2/He.

In the CH3F/O2/He based plasma, the fluorine compound is used to etch silicon nitride whereas oxygen makes it possible to limit the polymerization of methyl fluoride and is also used to oxidize silicon when such material is reached during etching. The oxide layer formed on silicon makes it possible to slow down the etching of silicon, but the price to pay is the transformation of the surface oxide thereof and thus a surface consuming of silicon. Helium is used as a thinner for oxygen and CH3F.

Such type of etching is advantageous in that it is anisotropic enough and makes it possible to sufficiently control the profiles of the spacers 150 even though the ideal rectangular shape cannot be reached in practice. Such type of etching is disadvantageous in that the selectivity of etching the underlying silicon is limited. Selectivity, i.e. the ratio of etching speed between silicon nitride and silicon is about 10 and may reach a maximum of 15 depending on the plasma forming conditions (nitride is etched 10 to 15 times quicker than silicon).

So called hydrofluoric acid (HF)- or phosphoric acid (H3PO4)-based <<wet>> etching is also used, with a much better selectivity, respectively, to silicon or silicon oxide (SiO2) but the profile of the spacers cannot be controlled since etching is mainly isotropic in this case. This etching type is called "wet clean".

It should be noted here that many publications exist about etching silicon nitride and/or gate spaces in general. Reference will be made to the following American patents or patent applications: 2003/0207585; U.S. Pat. Nos. 4,529,476; 5,786,276 and 7,288,482.

FIG. 2a illustrates a first problem relating to insufficient selectivity of attack existing during dry etching of the CH3F/O2/He type between silicon nitride and silicon on the surface layer 146. The result is that a significant part of the thin single-crystal silicon surface layer 146 of the SOI substrate can then be partially consumed 147 during the anisotropic etching of nitride. As mentioned above, the surface layer 146 is so selected as to have a low thickness, in order to enhance the electrical characteristics of the transistors. It is typically of less than 10 nm. The remaining thickness 145 may be very low. Under such conditions the following ionic implantation 105 for forming the source and drain zones 110 may significantly damage the remaining single-crystal silicon. The implantation energy of dopants may be sufficient to cause a complete amorphization 149 of the single-crystal silicon, which will then deeply affect specifically the following step of epitaxial growth 12 intended to form the raised source/drain. As mentioned above, the latter operation is required because of the reduction in the size of the transistors so that the resistances of access to the source and drain electrodes can be kept at sufficiently low values not to impact the electrical operation of the transistors. Growth from a silicon layer partially or totally made amorphous will cause many defects in the layer formed by epitaxy.

FIG. 2b illustrates another problem, wherein no significant consuming of the silicon of the surface layer 146 occurs, but <<feet>> 154 are formed at the lower part of the silicon nitride patterns remaining on the flanks of the gate after etching. The transition 114 of the junctions formed after doping by ionic implantation 105 of the source and drain zones 110 with the channel zone 130, is consequently much less rough than when the spacers have no feet, as shown in the previous figures. The presence of feet 154 affects the electrical characteristics of the transistors. It should be noted here that the forming or not of feet at the feet of the spacers and the consuming or not of the silicon of the silicon surface layer 146 of the SOI substrate, described in the previous figure, are etching antagonist adjustment parameters which require a compromise to be reached wherein, ideally, no feet are formed and the silicon surface layer is not significantly attacked.

FIG. 2c illustrates a third problem which arises when etching causes too important erosion of the spacers in the higher parts of the gates and exposes polycrystalline silicon 123 in such zones 156. This results in the subsequent epitaxial growth 112 aiming at forming raised source/drain also occurring at such places, as well as stray contacts being siliconized, which might cause short-circuits between the electrodes. As a matter of fact, etching spacers requires adjusted etching time to etch 150% of the thickness of deposited nitride, for instance. This means that 50% (here) over-etching is executed so as to take into account the non uniform deposition, or the etching operation proper, on the wafer. Too important over-etching, which exposes the gate zones 156 can thus be noted in some parts of the wafer. Such defect is also called "faceting".

It can be noted that although plasma etching made it possible to follow the reductions in the size of the patterns upon each introduction of a new technological node in the past, it raises always more numerous problems when size is reduced, more particularly from and beyond the 22 nm technological node. Using plasma etching for such dimensions induces an additional complexity to solve the above-mentioned problems. More complex etching chemistry than the so-called fluorocarbon conventional one has been tested, which requires the introduction of additional gas into the etching chamber. Up to five different kinds of gas were combined to form etching plasma. This results in a much more complex method.

The aim of the present invention is to provide a method for forming spacers used as insulators which would eliminate or at least reduce some defects in the production of transistors, such as consuming or altering the semi-conductor material (i.e. Si, SiGe) of the active layer, forming <<feet>> at the lower part of the patterns on the flanks of a transistor gate.

Another objective of the present invention is to avoid using fluorocarbon chemistry.

Other objects, characteristics and advantages of the present invention will become apparent upon examining the following description and the appended drawings. It should be understood that other advantages can be incorporated herein.

SUMMARY OF THE INVENTION

In order to achieve this objective, an aspect of this invention relates to a method for forming spacers of a gate of a field-effect transistor, with the gate having a top and flanks and being located above an active layer made of a semi-conductor material, comprising: a step of forming a protective layer covering said at least one step of forming a carbon film on the transistor; at least one step of removing portions of the carbon film, carried out by putting the carbon film in the presence of a plasma creating a bombardment of ions in such a way as to remove at least portions of the carbon film which are located on the top and on other side of the gate and which are perpendicular to the main direction by leaving in place residual portions of the carbon film on the flanks of the gate; at least one step of modifying the protective layer carried out by putting the protective layer in presence with a plasma comprising ions with a hydrogen base (H, $H^+$, $H_2^+$, $H_3^+$ etc.) and/or with a helium base (He) and creating an anisotropic bombardment of ions in such a way as to modify at least portions of the protective layer which are located on the top and on either side of the gate, by retaining unmodified portions of the protective layer covering the flanks of the gate and at least one step of removing the modified protective layer using a selective etching of the modified protective layer with respect to unmodified portions of the protective layer and with respect to residual portions of the carbon film.

As such the step of forming the carbon film and the at least one step of modifying the protective layer are carried out one after the other i.e. they are not carried out simultaneously.

As such during the step of modifying the protective layer the risks of seeing carbon penetrate into the active layer are prevented. The latter is therefore not altered. In the framework of this invention, it has been noted that if the step of forming the carbon film and the step of modifying the protective layer are carried out simultaneously, then a portion of the carbon present in the plasma intended to form the carbon film penetrates into the active layer and alters the latter. The performance of the transistor is then degraded.

The invention as such makes it possible to obtain gate spacers with particularly precise dimensions, while suppressing or even limiting the risks of consumption of semiconductor material and the forming of "feet" at the bottom of the gate. Moreover, the alteration of the semi-conductor material of the active layer is prevented which leads to defects during the later steps of epitaxial growth starting from the active layer.

Preferably, the step of removing the modified protective layer makes it possible to etch the modified protective layer selectively with respect to the unmodified portions of the protective layer and with respect to the residual portions of the carbon film.

As such the carbon film present on the flanks of the gate protects, during the step of removing the modified protective layer, the unmodified portions of the protective layer present between the carbon film and the gate.

Indeed, it is shown in practice that the selectivity between the modified protective layer and the unmodified portions is not infinite. This results in that without the residual portions of the carbon film a lateral consumption of the spacers is observed during the removal of the modified protective layer. This lateral consumption, even slight, induces a drop in the performance of the transistor.

The invention, by providing a protective carbon film that remains during the removal of the modified protective layer as such makes it possible to effectively preserve the thickness of the spacers and as such improve the performance of the transistor.

Moreover, in the embodiments where the carbon film covers the protective layer located on the flanks of the gate during the step of modifying the protective layer, this carbon film prevents the protective layer located on the flanks of the gate from being modified by a depletion of ions that would not have a direction perfectly parallel to the flanks of the gate. An involuntary modification of the protective layer located on the flanks of the gate during the step of modifying is as such prevented.

Moreover, the embodiments wherein the step of modifying the protective layer is carried out before covering the flanks of the gate with the carbon film, have for advantage to allow for an implantation as close as possible to the gate. The modified thickness of the protective layer is therefore controlled with more precision. In the end this embodiment makes it possible to respond with great effectiveness to the problem consisting in improving the precision of the forming of the spacers of the gate.

A carbon film is a film comprising chemical species containing carbon. According to a non-limiting embodiment the carbon film is made of carbon.

Moreover, the invention has as an advantage to not need fluorocarbon chemistries, of which some of the disadvantages have been repeated hereinabove.

Hereinafter are announced optional characteristics that can possibly be used combined together or alternatively with the characteristics hereinabove:

Preferentially, the plasma used during the step of removing portions of the carbon film comprises ions that are heavier than hydrogen (H2), said bombardment of the ions heavier than hydrogen being carried out anisotropically according to a main direction that is parallel to the flanks of the gate, in such a way as to remove at least the portions of the carbon film located on the top and on either side of the gate, by leaving in place residual portions of the carbon film on the flanks of the gate.

In an advantageous but not limiting manner, the plasma used during the step of removing portions of the carbon film comprises ions taken from argon (Ar), helium (He), nitrogen (N2) and oxygen (O2).

The bombardment with ions heavier than hydrogen destroys the carbon film formed on the surfaces perpendicular to the main direction of implantation.

The main direction is also designated as direction of bombardment or favored direction of bombardment.

Preferably, the step of modifying the protective layer is carried out in such a way that the plasma provokes an anisotropic bombardment of ions with a hydrogen or/and helium base according to a favored direction that corresponds to said main direction and which is parallel to the flanks of the gate.

Ions with a hydrogen base are preferably taken from: H, $H^+$, $H_2^+$, $H_3$+.

Preferably, the step of modifying the protective layer is carried out in such a way that the ions of the plasma (i.e. the ions with a hydrogen base (H, $H^+$, $H_2^+$, $H_3^+$ etc.) and/or a helium base (He)), are implanted in portions of the protective layer to be etched later.

Advantageously, the step of removing portions of the carbon film is carried out in such a way as to remove all of the carbon film located on the top and on either side of the gate.

Advantageously, the step of removing portions of the carbon film is carried out in such a way as to retain all of the carbon film located on the flanks of the gate.

In an advantageous but not limiting manner, the step of removing portions of the carbon film and the step of modifying the protective layer are carried out simultaneously, preferably by using the same plasma comprising ions with a hydrogen (H, $H^+$, $H_2^+$, $H_3^+$ etc.) or/and helium (He) base. Preferentially, said plasma further comprises ions that are heavier than hydrogen taken from argon (Ar), helium (He), nitrogen (N2), and/or oxygen (O2).

In other words, the step of modifying is carried out in such a way as to remove the carbon film in particular on the surfaces perpendicular to the main direction of implantation.

Said unmodified portions of the protective layer can as such constitute protective spacers of the gate.

According to an embodiment where the protective layer has a nitride base, the bombardment of hydrogen (H) and/or helium (He) ions during the step of modifying leads to implanting these ions in the targeted layers. This modification by implantation of ions makes it possible to substantially improve the selectivity of this layer with respect to the semi-conductor material, typically silicon. This implantation also makes for the thickness of the modified protective layer being etched faster than the unmodified protective portions.

The etching as such consumes the modified protective layer preferentially to the layer of semi-conductor material and to the unmodified portions of the protective layer. As such, the risk of excessive consumption of the surface layer of semi-conductor material is reduced and even eliminated.

Preferably, the modification of the protective layer retains an unmodified thickness on the flanks of the gate. This thickness is retained, at least partially, during the selective etching. It then defines protective gate spacers.

The invention as such makes it possible to obtain protective spacers while still reducing and even eliminating the problems of the known solutions and mentioned hereinabove.

The implantation carried out by a plasma comprising said ions with a hydrogen (H, $H^+$, $H_2^+$, $H_3^+$ etc.) and/or helium (He) base has for advantage to enable a continuous implantation into a volume extending from the surface of the implanted layer.

Besides, using plasma enables an implantation at lower depths than the minimum depths which can be obtained with implanters. Thus, an implantation with plasma makes it possible to efficiently and relatively homogeneously or at least continuously implant thin thicknesses which can then be removed with a selective etching. Such continuous implantation from the implanted face makes it possible to enhance the homogeneity of the modification according to the depth, which leads to a time-constant speed of etching of the implanted layer. Besides, the increase in the selectivity conferred by the implantation as compared to other layers is effective as soon as etching of the implanted layer is started. Plasma implantation also enables a significantly enhanced control of etching accuracy.

The plasma implantation of species with a hydrogen base typically makes it possible to implant then to remove thicknesses extending from the surface of the implanted layer and on a depth ranging from 0 nm to 100 nm. Conventional implanters, enable an implantation in a volume ranging from 30 nm to several hundreds of nanometers. However, conventional implanters do not make it possible to implant the species between the surface of the layer to be implanted and a depth of 30 nm. When developing the present invention, it has been noted that the implanters do not make it possible to obtain a sufficiently constant speed of etching of the modified protective layer, from the surface of the latter, thus leading to less etching accuracy compared to what the invention enables.

Using plasma to modify the portion to be removed is thus particularly advantageous within the scope of the invention which aims at removing a thin thickness of nitride, typically between 1 and 10 nm and more generally between 1 and nm.

The step of modification carried out using a plasma modifies the protective layer continuously from the surface of the layer of protection and over a thickness between 1 nm and 30 nm and preferably between 1 nm and 10 nm.

As such, during the steps of removing the carbon film and of modifying the protective layer carried out preferentially simultaneously, the conditions of the plasma, the energy of the ions and the main direction of implantation are chosen in such a way that:

The plasma creates a bombardment of ions with a hydrogen (H, $H^+$, $H_2^+$, $H_3^+$ etc.) or/and helium (He) base anisotropically according to the main direction which is parallel to the flanks of the gate and in such a way as to modify at least one upper portion of the thickness of the protective layer on the flanks of the gate by retaining unmodified portions of the protective layer covering the flanks of the gate, the plasma creates a bombardment with ions heavier than hydrogen that removes the carbon film previously formed on surfaces perpendicular to the main direction.

BRIEF DESCRIPTION OF THE FIGURES

The goals and objectives as well as the characteristics and advantages of the invention will better emerge from the detailed description of an embodiment of the latter which is illustrated by the following appended drawings wherein:

FIGS. 4a to 4c, 5, 4d and 4e respectively show a structure of a transistor obtained after one of the steps of a method according to an alternative embodiment of the invention.

Figure 1:
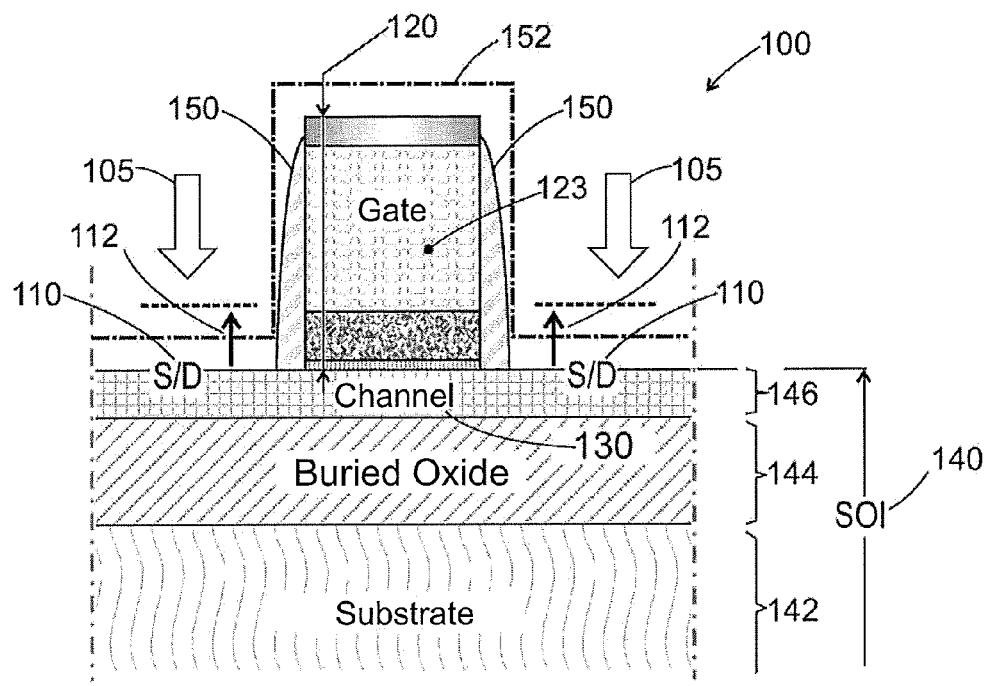
FIG. 1 shows a cross-sectional view of an exemplary MOSFET transistor of the FDSOI type being produced.

The drawings attached are given as examples and are not limiting to the invention. Such drawings are schematic representations and are not necessarily to scale with a practical application. More particularly, the relative thickness of the various layers and substrates are not a representation of reality.

DETAILED DESCRIPTION OF THE INVENTION

It should be noted that, within the scope of the present invention, the words "on", "over" or "underlying" or the equivalents thereof do not necessarily mean "in contact with". Thus, for instance, depositing a first layer on a second layer does not necessarily mean that the two layers are directly in contact with each other, but this means that the first layer at least partially covers the second layer by being either directly in contact therewith or by being separated therefrom by another layer or another element.

In the following description, thickness is generally measured in directions perpendicular to the plane of the lower face of the layer to be etched or of a substrate whereon the lower layer has been deposited. Thickness is thus generally measured along a vertical direction in the figures shown. On the contrary, the thickness of a layer covering a flank of a pattern is measured along a direction perpendicular to such flank.

Before making a detailed review of the embodiments of the invention, optional characteristics which may be used in combination or as alternative solutions are listed hereafter:

The ions heavier than hydrogen of the plasma, taken from argon (Ar), helium (He), nitrogen (N2), xenon (Xe) and oxygen (O2), can be used alternatively or in combination in the same plasma. Their role is to prevent the formation of the carbon film in the bottom of the pattern. Other ions can be suitable.

The protective layer is preferentially a layer of silicon nitride.

The step of removing the modified protective layer, is preferably carried out by elective wet etching with carbon, to the unmodified portions of the protective layer, and/or to said semi-conductor material of the active layer and/or to silicon oxide (SiO2). In this case, the modified protective layer is consumed very easily with respect to the consumption of the carbon, of the semi-conductor material of the active layer (typically silicon) and/or of the silicon oxide (SiO2).

In a preferred embodiment where the protective layer is with a nitride base, the solutions provide indeed an etching solution with a hydrofluoric acid (HF) base that consumes the nitride at a speed of 0.5 nm/minute and with a selectivity of the nitride with respect to the silicon of about 20 to 30.

In addition, the selectivity of the modified nitride with respect to the carbon and the unmodified nitride is respectively greater than 100 and 30.

This therefore makes it possible to substantially improve the selectivity and therefore the precision of the etching.

An excessive consumption of the active layer, exposure of the flanks of the gate or forming feet are as such prevented.

Other optional characteristics of the invention, that can be implemented in a combined manner according to all of the combinations or alternatively, are indicated hereinafter:

Preferentially, the protective layer is a layer with a nitride base or a layer of which the material has a dielectric constant less than or equal to 8 and preferably less than 7. According to an embodiment the material has a dielectric constant less than or equal to that of silicon nitride.

In a preferred embodiment, the protective layer is a layer with a silicon nitride base. Advantageously, the protective layer is a layer of silicon nitride.

In another advantageous embodiment, the material of the protective layer is taken from boron nitride (BN), SiCBN, SiOCN, SiCO, SiC.

According to an embodiment, the implantation parameters, in particular the energy communicated to the ions with a hydrogen (H, H$^+$, H$_2^+$, H$_3^+$ etc.) base and/or a helium (He) base, the dose of implantation and the main direction of implantation, as well as the nature of the ions are provided in such a way that the modified portions of the layer to be etched can be selectively etched with respect to the carbon film. These parameters are also configured in such a way that the modified portions of the layer to be etched can be selectively etched with respect to the unmodified portions of the layer to be etched. These parameters are also configured in such a way that the modified portions of the layer to be etched can be selectively etched with respect to the underlying layer of the layer to be etched.

Advantageously, the step of forming a carbon film is carried out using a plasma with a CxHyFz, CxHy or CxFy base where x is the proportion of carbon, y and/or z are respectively the proportion of hydrogen or/and fluorine.

Advantageously, the CxHy is CH4.

Advantageously, the step of forming a carbon film is carried out by using an inductively coupled plasma (ICP) or a capacitive coupled plasma (CCP).

Advantageously, the step of forming the carbon film is carried out by plasma enhanced chemical vapor deposition (PECVD).

Advantageously, the step of removing the modified protective layer is selective of the modified protective layer with regards to the active layer.

Advantageously, during the step of modifying the conditions of the plasma, in particular the concentration, the energy of the ions with a hydrogen base (H, H$^+$, H$_2^+$, H$_3^+$ etc.) and/or a helium base (He) and the main direction of implantation of these ions are chosen in such a way that, on the surfaces perpendicular to the direction of implantation, the entire thickness of the protective layer is modified by the implantation of ions of the plasma of the step of modifying and the step of removing is carried out in such a way as to remove the entire modified protective layer, as such exposing the active layer on the surfaces perpendicular to the direction of implantation.

Advantageously, during the step of removing the modified protective layer is carried out by wet etching.

Advantageously, the selective etching with silicon is obtained using a solution with a hydrofluoric acid (HF) or H3PO4 base.

Advantageously, the semi-conductor material is silicon and the step of removing the modified protective layer is carried out by selective wet etching to said semi-conductor material of the active layer and/or to a layer of silicon oxide (SiO2) overmounting the gate.

Alternatively, the step of removing is carried out by selective dry-etching of said modified protective layer to be etched with respect to said carbon film, with respect to unmodified portions of the protective layer and with respect to said semi-conductor material. In addition the dry etching also does not remove the silicon oxide (SiO2) forming a hard mask at the top of the gate.

Preferably, the semi-conductor material is silicon and the step of removing the modified protective layer is carried out by selective dry-etching with silicon (Si).

Preferentially, the dry etching is carried out in a plasma formed in a confined enclosure using nitrogen trifluoride (NF3) and ammonia (NH3).

Advantageously, the implantation and the removal of the protective layer are carried out in the same plasma reactor. A modification of the layer to be removed carried out by an implantation by plasma as such makes it possible to carry out the modification of the protective layer and the etching in the same chamber which is very advantageous in terms of simplification, time and cost of the method.

Advantageously, the dry etching comprises: a step of etching consisting in the forming of solid salts; and a step of sublimation of the solid species. This embodiment makes it possible to obtain a very good selectivity of the etching of the modified nitride with respect to the unmodified nitride and with the unmodified semi-conductor material. In particular, this selectivity of the etching is much higher (typically by a factor of 10 at least) to that obtained with an HF solution.

Advantageously, the step of modifying the protective layer is carried out after the step of forming the carbon film and after the step of removing portions of the carbon film.

Advantageously, the step of modifying the protective layer is carried out before the step of forming the carbon film.

In a preferred but not limiting manner, the method comprises several sequences each comprising a step of removing the carbon film and/or a step of modifying the protective layer and a step of removing, and during at least one of the steps of modifying, only a portion of the thickness of the thickness of the protective layer is modified.

The sequences are preferably repeated until disappearance of the protective layer on all of the surfaces parallel to the plane of a substrate whereon the gate rests.

In an embodiment, the step of modifying is a single step carried out in such a way as to modify the protective layer to be etched in all of its thickness over all of the surfaces parallel to the plane of a substrate whereon the gate rests and to not modify the protective layer in all of its thickness on the surfaces perpendicular to this plane. This embodiment allows for particular precise control of the dimension of the spacers.

In a preferred but not limiting manner, the step of modifying is preceded by a step of anisotropic etching that is carried out in a plasma of the CH3F/O2/He type. This embodiment makes it possible to remove a substantial thickness of the protective layer in one step then to refine the control of the thickness on the flanks during a second step. This embodiment as such makes it possible to reduce manufacturing time.

Advantageously, the gate of the transistor is located on a stack of layers forming an elaborated substrate of the silicon on insulator (SOI) type.

Advantageously, the semi-conductor material is taken from: silicon (Si), germanium (Ge), silicon-germanium (SiGe). The step of removing the modified layer with a silicon nitride base is carried out by selective wet etching with Ge or with SiGe or and/or with SiGe oxide or with Ge oxide.

Advantageously, the step of modification carried out using a plasma modifies the protective layer continuously from the surface of the layer with a nitride base and over a thickness between 1 nm and 30 nm and preferably between 1 nm and 10 nm.

Advantageously, the transistor is a transistor of the FDSOI type.

As has been seen an object of the invention is to overcome all or at least some of the problems mentioned hereinabove.

Figure 3:
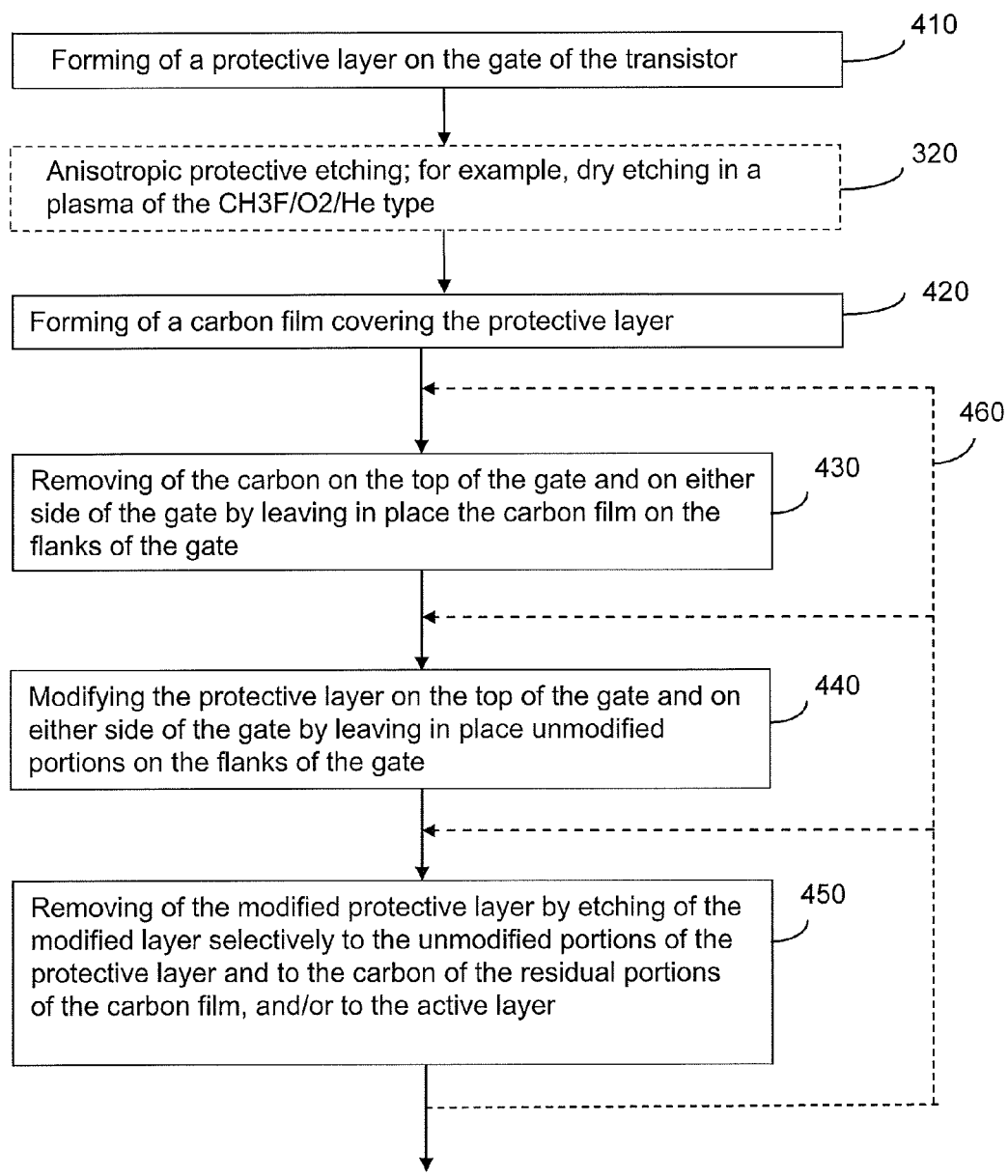
FIG. 3 summarizes the main steps of several examples of the method of forming spacers of a transistor according to the invention.

FIG. 3 summarizes the main steps 410 to 450 of several detailed examples of methods according to the invention of forming spacers of a transistor. These steps 410 to 450 can also apply to the forming of spacers on the flanks of gates of various transistors: FDSOI or other. The steps 410 to 450 shall be detailed respectively in the paragraphs hereinbelow concerning FIGS. 4a to 4e, 5, 8a to 8f respectively showing a structure of a transistor 200 obtained at the end of one of the steps 410 to 450 according to an embodiment of the invention.

Figure 4A:
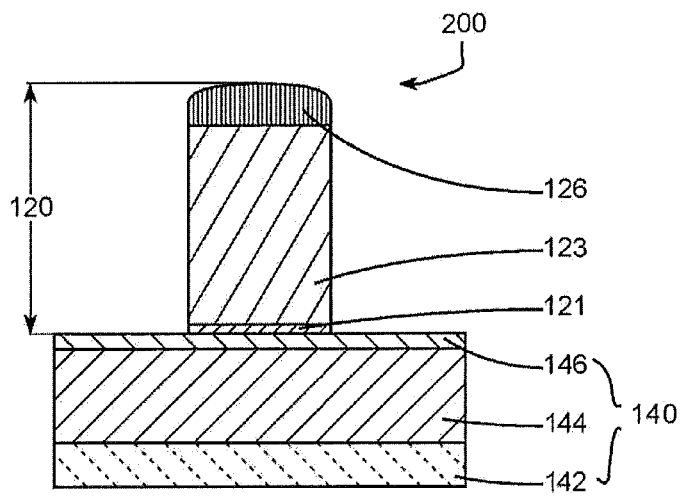
FIGS. 4a to 4e show the structures obtained at the end of some of the steps of the methods according to the embodiments of the invention.

FIG. 4a shows a structure of a transistor 200 formed on a substrate 140 of the SOI type comprising an active layer 146 is overmounted by a gate 120 of the transistor 200.

The forming of the transistor 200 consists in carrying out an elaborate substrate 140 of the SOI type, using a substrate 142, often designated as a bulk substrate, an initial insulating layer 144 and the active layer 146, with the latter intended to subsequently form a conduction channel of the transistor 200.

Advantageously, the semi-conductor material is taken from: germanium (Ge), silicon-germanium (SiGe).

In addition to a layer of polycrystalline silicon 123 there is in a stack of layers forming the gate 120 first of all a thin insulating layer of gate oxide 121 through which an electric field will be able to develop in order to create an underlying conduction channel 130 between source and drain when sufficient electrical voltage is applied to the gate 120. With the most recent MOSFET transistors a technology is implemented qualified as "high-k/metal gate" i.e. the dielectric layer 121 is made from an insulating material with high permittivity (high-k) covered by a metal layer (metal gate; not shown in the figures) of the gate 120. At this stage, the stack of layers of the gate 120 also comprises a protective hard mask 126 which will be removed later in order to allow for the putting back into contact on this electrode. This hard mask 126, which remains in place after etching of the gate, is typically made of silicon oxide ($SiO_2$). Its role is to protect the top of the gate 120 from any damage during the carrying out of the following steps and in particular those of etching the spacers.

Preferably, the dielectric layer 121 is arranged in contact with the active layer 146 forming the conduction channel. Preferably, the metal layer is arranged in contact with the dielectric layer 121. Preferably, the layer of polycrystalline silicon 123 is arranged directly in contact with the gate oxide formed by the dielectric layer 121 if the metal layer is absent or is arranged directly in contact with the metal layer.

Figure 4B:
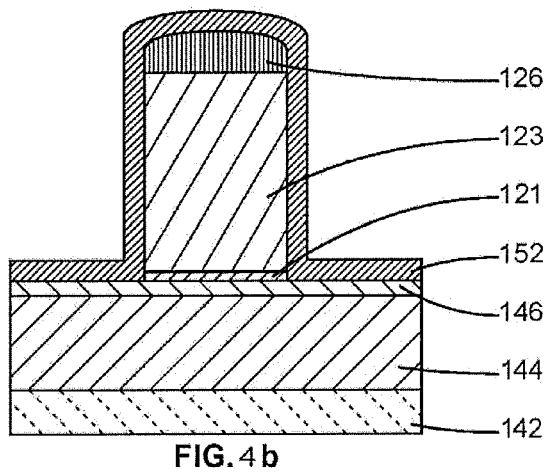

FIG. 4b shows a structure obtained after the step of forming 410 a protective layer 152 covering the transistor 200.

The step of forming 410 of the protective layer 152, of a thickness preferentially substantially constant, is carried out in such a way as to cover the transistor 200, i.e. over all of the surfaces, vertical and horizontal, of the devices during manufacture. This is as such a deposition that is preferably conformal. In a preferred but not limiting manner, the protective layer 152 is arranged directly in contact with the surfaces of the structures during manufacture.

This step of forming 410 is carried out preferably using a method of depositing called LPCVD (low pressure chemical vapor deposition). This type of deposition which is practiced under atmospheric pressure indeed makes a uniform deposition it possible on all of the surfaces regardless of their orientation.

The protective layer 152 is preferably a layer of silicon nitride of a chemical compound Si3N4 or SiN. In another embodiment, the protective layer 152 is a layer of which the material has a dielectric constant less than or equal to that of silicon nitride, such as boron nitride (BN), SiCBN, SiOCN, SiCO, SiC, etc. These materials that have a low dielectric constant make it possible to reduce the parasite capacity in order to possibly improve the performance of the transistor.

Preferably, the material of the protective layer 152 is compatible with dry or wet cleaning carried out in a following step 450 in order to remove a modified protective layer 158 (described later).

The thickness of the protective layer 152 is preferably sufficiently large, so that after the carrying out of the steps of modifying 470 and of removing 450 (described later), there remains unmodified portions 152a, 152b of the protective layer 152 on the flanks of the gate 120.

In a preferred embodiment, the thickness of the protective layer 152 is between 5 nanometers (nm) and 30 nm, preferably 10 nm.

Figure 4C:
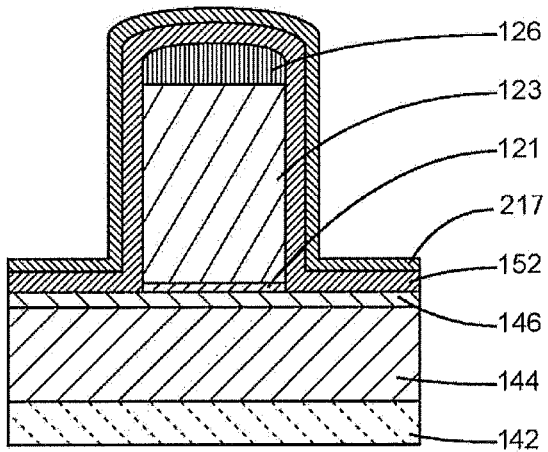

FIG. 4c shows the structure of the transistor 200 after the step of forming 402 of a carbon film 217.

The step of forming 410 of the carbon film 217, of a thickness preferentially substantially constant, is carried out in such a way as to cover the transistor 200, i.e. over all of the surfaces, vertical and horizontal, of the devices during manufacture. This is as such a deposition that is preferably conformal. In a preferred but not limiting manner, the carbon film 217 is arranged directly in contact with the surfaces of the structures during manufacture.

The step of forming 420 the carbon film 217 is carried out using an etching reactor such as CxHyFz, CxHy or CxFy base where x is the proportion of carbon, y and/or z are respectively the proportion of hydrogen or/and fluorine, in order to form a carbon film 217. The carbon of the carbon film 217 comes from the etching reactor.

Preferentially, the etching reactor is a reactive gas with a methane (CH4) base.

Note here that the step of forming 420 of the carbon film 217 can be practiced in many different ways by adapting all sorts of means commonly used by the microelectronics industry, such as with the assistance of any etcher, for example in an ICP reactor "Inductively Coupled Plasma), or in a reactor of the CCP type (Capacitive Coupled Plasma) which makes it possible to control the energy of the ions.

In another embodiment, the carbon film 217 obtained at the end of the step of forming 420 of the carbon film is formed using a deposition method called LPCVD (low pressure chemical vapor deposition). This type of depositing which is practiced under atmospheric pressure indeed makes a uniform deposition it possible on all of the surfaces regardless of their orientation. As such a deposition that is preferably conformal is obtained.

The carbon film 217 obtained is of a thickness preferentially substantially uniform, over all of the surfaces of the devices during manufacture. According to this preferred but non-limiting embodiment, the carbon film 217 is arranged directly in contact with the protective layer 152.

Preferably, the thickness of the carbon film 217 is between 0.5 and 10 nm and preferably between 1 nm and 5 nm so as to have a total thickness of spacing, defined by all of the carbon film 217 and of the protective layer 152, formed between 9 nm and 15 nm.

Figure 4D:
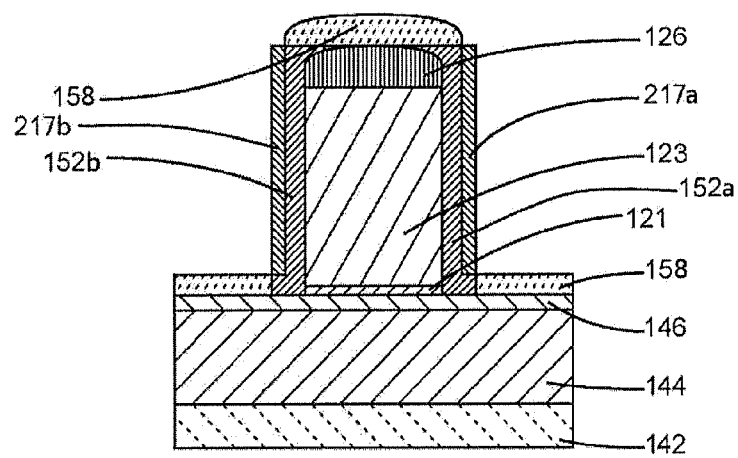

FIG. 4d shows the structure of the transistor 200 at the end of two steps comprising a step of removing 430 of portions of carbon film 217 and a step of modifying 440 the protective layer 152.

According to an advantageous but non-limiting embodiment, these two steps 430 and 440 are carried out simultaneously. In other embodiments (described later), the steps 430 and 440 are carried out successively.

In addition, in another embodiment (described later), the steps 420, 430 and 440 can be carried out in an order that is different from that of the steps 420 to 440 of this embodiment shown in FIGS. 4a to 4e.

In this embodiment, these steps 430 and 440 can, as the step of forming 420 of the carbon film mentioned hereinabove, be done in several ways such as by using any type of etcher, for example ICP, CCP, or by using a method of deposition of the PECVD type.

Note here that these steps of modifying 430 and/or 440 can be practiced in many different ways by adapting all sorts of means currently used in the microelectronics industry. In particular, standard etchings are used of which low or high density plasmas can be developed and wherein the energy of the ions can be controlled (such as CCP) in order to allow for the implantation of the species intended to modify the protective layer 152 to be etched later during a step 450. A type of plasma referred to as immersion that is commonly used to carry out an implantation of species on the surface of a device being manufactured can also be used.

Advantageously, the equipment used (ICP, CCP, PECVD for example) to carry out the step of forming 420 the carbon film is also used to carry out the step of removing 430 and/or the step of modifying 440 the protective layer 152.

According to this non-limiting embodiment, the steps 430 and 440 are done by putting the carbon film 217 as well as the protective layer 152 into presence with a plasma containing species such as hydrogen (H2) and/or helium (He). Alternatively and preferentially, said plasma comprises, in addition to H2 or/and He, heavy ions such as nitrogen (N2), argon (Ar), xenon (Xe) or/and oxygen (O2).

More precisely, the species of the plasma such as hereinabove fulfill at least one of the functions hereinbelow:

"a" (step of removing 430) Removal of portions of the carbon film 217 carried out, preferentially anisotropically, in such a way as to remove portions of the carbon film 217 that are perpendicular to the flanks of the gate 120 by leaving in place residual portions 217a, 217b of the carbon film 217 on the flanks of the gate 120;

"b" (step of modifying 440) Modification of the protective layer 152 carried out, preferentially anisotropically, in such a way as to form a modified protective layer 158 by modifying portions of the protective layer 152 that are perpendicular to the flanks of the gate 120 by retaining unmodified portions 152a, 152b of the protective layer 152 covering the flanks of the gate 120. As such the protective layer 152 located on the top of the gate 120 and on either side of the gate 120 is modified. The protective layer 152 located on the flanks of the gate 120 is not modified.

In order to fulfill the function "a" hereinabove, the plasma generally comprises hydrogen or ions heavier than hydrogen such as helium (He), argon (Ar), nitrogen (N2), and oxygen (O2). With a concern for concision, these ions are designated in rest of the description as "heavy ions".

More precisely, the heavy ions of the plasma pulverize the carbon species of the carbon film 217 (formed after the step 420) on the walls perpendicular to the direction of implantation, such as on the surfaces of the protective layer 152 covering the active layer 146 and the hard mask 126 at the top of the gate 120. On the other hand, on the surfaces that receive a bombardment of ions to a lesser degree or that do not receive a bombardment of ions, such as on the surfaces of the protective layer 152 on the flanks of the gate 120, this carbon film 217 remains in place.

The nature of the heavy ions and the parameters of the plasma, in particular its energy, makes it possible to ensure a depletion of the methyl groups of the carbon film 217 carried out anisotropically, in such a way that portions of the carbon film 217 that are perpendicular to the flanks of the gate 120 are removed. The function "a" is therefore ensured.

In a preferred embodiment, the plasma comprises helium (He) as He is particularly effective to ensure the function "a". Preferably, the plasma comprising He is used with a low energy between 20 eV and 500 eV in order to both ensure a depletion of the groups in order to remove the carbon film 217 (step 430) and to not entirely modify the protective layer 152 (step 440).

In another embodiment where Argon is the only type of heavy ions contained in the plasma, Argon allows, possibly Argon alone, for the removal of portions of the carbon film 217 on the surfaces perpendicular to the direction of bombardment. Combined with He, N2, and/or O2 it contributes to pulverizing the carbon film 217 and as such removing it.

Consequently, at the end of the step of removing 430, there remains only the residual portions 217a, 217b of the carbon film 217 on the flanks of the gate 120. The residual portions 217a, 217b will therefore become carbon spacers 217a, 217b that will protect the flanks of the gate 120 from the attack of the HF solution for example, during the carrying out of the step of removing 450 of the modified protective layer 158 which will be described later.

Note that particularly advantageously, the carbon film 217 acts as a protector for the protective layer 152 that it covers, reducing the thickness whereon the ions with a hydrogen base (H, $H^+$, $H_2^+$, $H_3^+$ etc.) and/or with a helium base (He) penetrate into the protective layer 152 and modify the latter during the step of modifying the protective layer 152. As such, the carbon film 217 makes it possible to increase the difference in thickness of modification between the surfaces covered by the carbon film 217 and the surfaces that are not covered by it. The modified thickness is as such even better controlled and therefore the etched thickness of the protective layer 152.

The function "b" is provided by ions with a hydrogen or/and helium base, typically the hydrogen ion (H) or/and the helium ion (He). These ions have for property to easily penetrate and in depth into the protective layer 152 and as such modify the latter. With respect to the species He, the species H2 function more effectively as they modify the protective layer 152 but without pulverizing it.

The plasma of the step of modifying 440 the protective layer 152 can as such be formed using a gas with a He and/or hydrogen base such as NH3 or HBr for example.

With respect to the use of a single type of species He, the combination of species He and H2 makes it possible to reduce the energy of the ions and to have better precision of the thickness of the protective layer 152 to be modified and to be etched. In addition, said combination of species He and H2 makes it possible to reduce the risk of amorphization of the Si or of the SiGe.

Note that in the embodiments wherein the plasma of the step of modifying 440 of the protective layer 152 comprises light ions with a hydrogen base (H, $H^+$, $H_2^+$, $H_3^+$ etc.) and/or with a helium base (He) and heavy ions (He, Ar, N2, Xe or O2 for example), the light ions participate in synergy with the heavy ions of the plasma in the modification of the protective layer 152. The heavy ions make it possible to reinforce the action of the light ions but they penetrate themselves much less deeply into the protective layer 152. These heavy ions remain located on the surface of the protective layer 152 and are therefore not able to modify a substantial thickness, and a fortiori all of the thickness, of the protective layer 152. The depth of penetration of the heavy ions is about ten times less than the depth of penetration of the light ions. The depth of penetration of these heavy ions is identical and even less than the depth at which the material of the protective layer 152 is pulverized. Typically with argon ions (Ar) there is a penetration of 1 nm in the nitride for an energy of 300 eV, however at the same time the rate of pulverization is 1-2 nm.

More precisely, the ions with a hydrogen and/or helium base can be implanted in a material to be etched, without provoking a dislocation of its atomic structure such that it would result in a pulverization of the latter, and therefore without a re-depositing of the material etched on the walls of the reactor or the patterns during the etching itself, can be suitable.

This step of modifying 440 of the protective layer 152 is carried out so that the plasma is anisotropic in such a way as to bombard the ions in a favored direction parallel to the flanks of the gate 120. The plasma used during this step 440 creates a bombardment of ions that are implanted at least in an upper portion of the thickness of the protective layer 152 on surfaces perpendicular to the flanks of the gate 120.

The step of modifying 440 is carried out though an implantation using a plasma has the advantage of allowing for a continuous implantation from the free surface of the protective layer 152 and over a low thickness, typically between 0 and 100 nm even between 0 and 30 nm. It also makes it possible to benefit from improved selectivity from the beginning of the etching and from a constant etching speed, resulting in improved etching precision.

The use of a plasma in order to implant the protective layer 152 as such makes it possible to remove a very thin layer, typically between 1 and 10 nm and more generally between 1 and 30 nm.

Ions with a hydrogen base are preferably taken from: H, H+, H2+, H3+. In the rest of the description, and with a concern for concision, these ions with a hydrogen base will be designated as "hydrogen ions".

As such, the ions modify the surfaces perpendicular to the direction of bombardment such as the surface at the top of the gate 120 and the surfaces of the protective layer 152 covering the active layer 146. On the other hand, the surfaces parallel to the direction of bombardment, i.e. the thickness of the protective layer 152 on the flanks of the gate 120, are protected by the carbon spacers 217a, 217b and therefore are not modified. As mentioned hereinabove, an unmodified thickness 152a, 152b covering the flanks of the gate 120 is retained. These unmodified portions 152a, 152b will become protective spacers 152a, 152b.

Note that during the step 440 of modifying the protective layer 152, the use of CxHy such as CH4 is avoided so as to not risk implanting carbon species in the active layer for example made of Si or SiGe or in the substrate 140.

As such, at the end of the steps 430 and 440, the carbon film 217 formed covers only the surfaces that are perpendicular or highly inclined with respect to the plane of the substrate 140, such as the upper surfaces of the modified protective layer 158 on the flanks of the gate 120.

In order to choose the implantation parameters those skilled in the art, in order to determine the behavior of the material to be etched in the type of implanter chosen, will preferably carry out beforehand "full plate" tests in order to establish the behavior curves. They will deduce from this the implantation parameters, in particular the energy and the dose of ions, i.e. the exposure time, to be used in order to reach the desired thickness of the material to be modified.

As an example, the table hereinafter gives the typical conditions for implementing the step of removing 430 of the carbon film 217 as well as the step of modifying 440 of the protective layer 152, carried out by the use of a He/H2 plasma, according to the time in seconds and the polarization power (bias) in watts, etc. These conditions largely depend on the thickness to be modified of the protective layer 152 and/or that to be removed from the carbon film 217.

| Etching reactor: | inductively coupled plasma of He/H2 (He: 50-500 sccm, H2: 10-500 sccm) |
|---|---|
| Thickness of the protective layer 152 to be modified (thickness of the modified protective layer 158): | 1-to several tens of nm |
| Power of the source: | 0-2000 Watts |
| Polarization power (energy of the ions): | 20-500 V |
| Pressure: | 5 milli Torr-10 milli Torr |
| Temperature: | 10-100° C. |
| Time: | a few seconds to several hundred seconds |

A more precise example of the implementation of the step of modifying 440 making it possible to modify a thickness of 15 nm of the protective layer 152 of nitride, carried out by the use of a He plasma, is described in the table hereinbelow:

| Etching reactor: | inductively coupled plasma of He (He: 250 sccm) |
|---|---|
| Thickness of the protective layer 152 to be modified (thickness of the modified protective layer 158): | 15 nm |
| Power of the source: | 500 W |
| Polarization power (energy of the ions): | 350 V |
| Pressure: | 10 milli Torr |
| Temperature: | 60° C. |
| Time: | 60 seconds |

Preferentially, the protective layer 152 is modified over all of its thickness above the gate 120 and above the active layer 146 and while still leaving in place unmodified portions 152a, 152b of the protective layer 152 on the flanks of the gate 120.

Figure 4E:
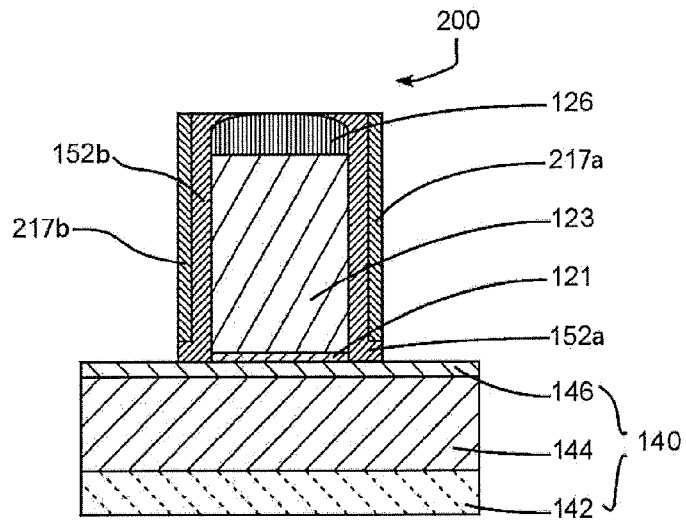

FIG. 4e shows the result of the step of removing 450 of the modified protective layer 158 after having carried out an operation of selective etching of the modified protective layer 158 with respect: to the carbon film 217, to the unmodified portions 152a, 152b of the protective layer 152 and to the active layer 146. The invention makes it possible to prevent consuming the protective layer 152 located on the flanks of the gate 120 due to the selective etching and due to the protection provided by the carbon film 217.

The etching solution as such etches the modified protective layer 158 to which it directly has access on the top of the gate 120 and on either side of the gate 120. The etching solution as such consumes the modified protective layer 158.

In a preferred embodiment, the carbon spacers 217a, 217b remain in place; i.e. there are two layers of spacers—carbon spacers 217a, 217b and protective spacers 152a, 152b—use to protect the flanks of the gate 120.

Advantageously, the parameters of the step of removing 450 the modified protective layer 158 are also configured in such a way that the modified dielectric layer 158 can be selectively etched with respect to the layer made with an oxide typically an oxide of said semi-conductor material, with the latter forming for example a layer of gate oxide. Typically, the selective etching of the modified protective layer 158 does not consume the silicon oxide $SiO_2$.

Advantageously, these parameters are also configured in such a way that the modified protective layer 158 can be selectively etched with respect to the semi-conductor material of the active layer 146.

In a preferred embodiment of which the modified protective layer 158 is of silicon, the step of removing 450 can be carried out by wet etching by using an etching solution with a hydrofluoric acid (HF) base or with a phosphoric acid (H3PO4) base.

Figure 2A:
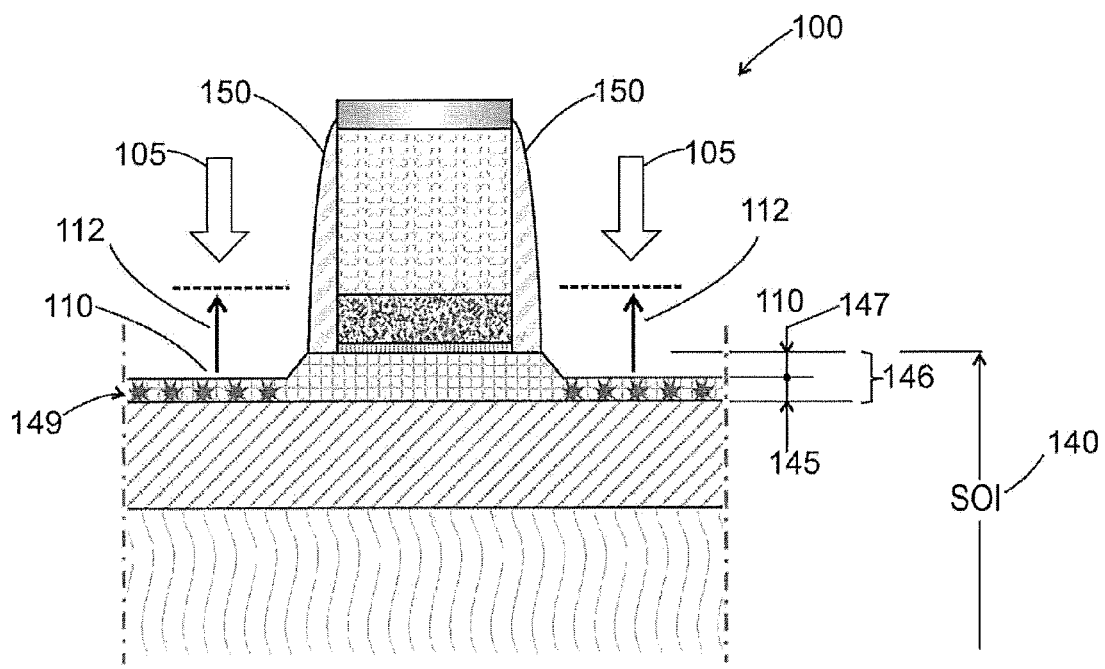
FIGS. 2a to 2c show different defects which may be observed on FDSOI transistors structures upon etching spacers using either one of the standard anisotropic etching methods developed by the microelectronics industry.
Figure 2B:
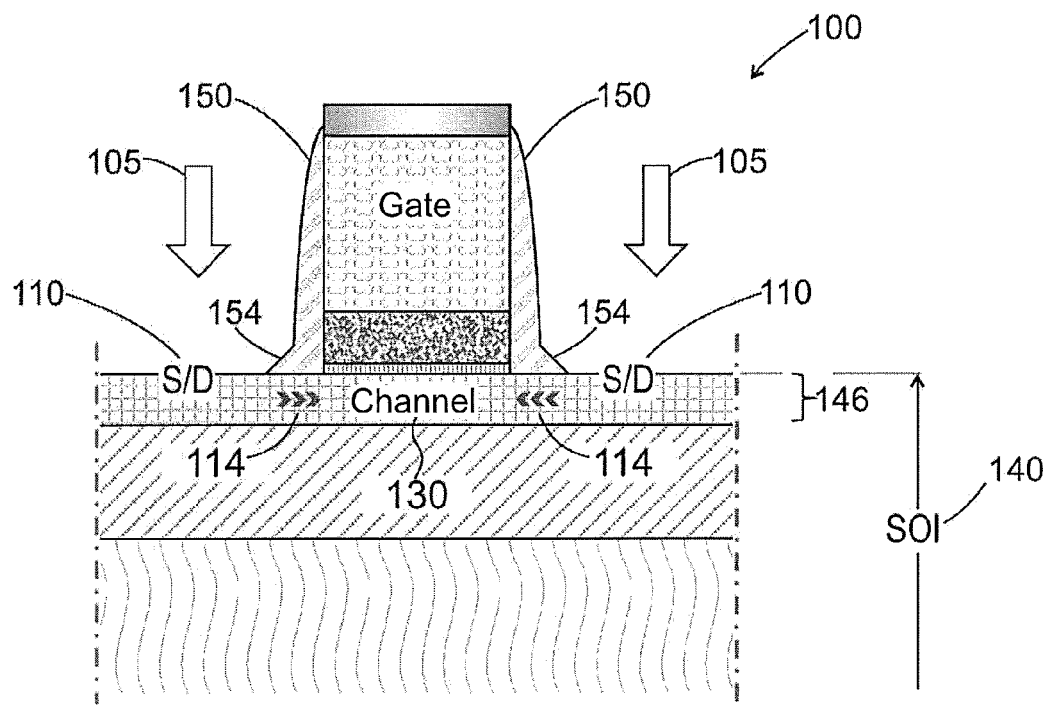
Figure 2C:
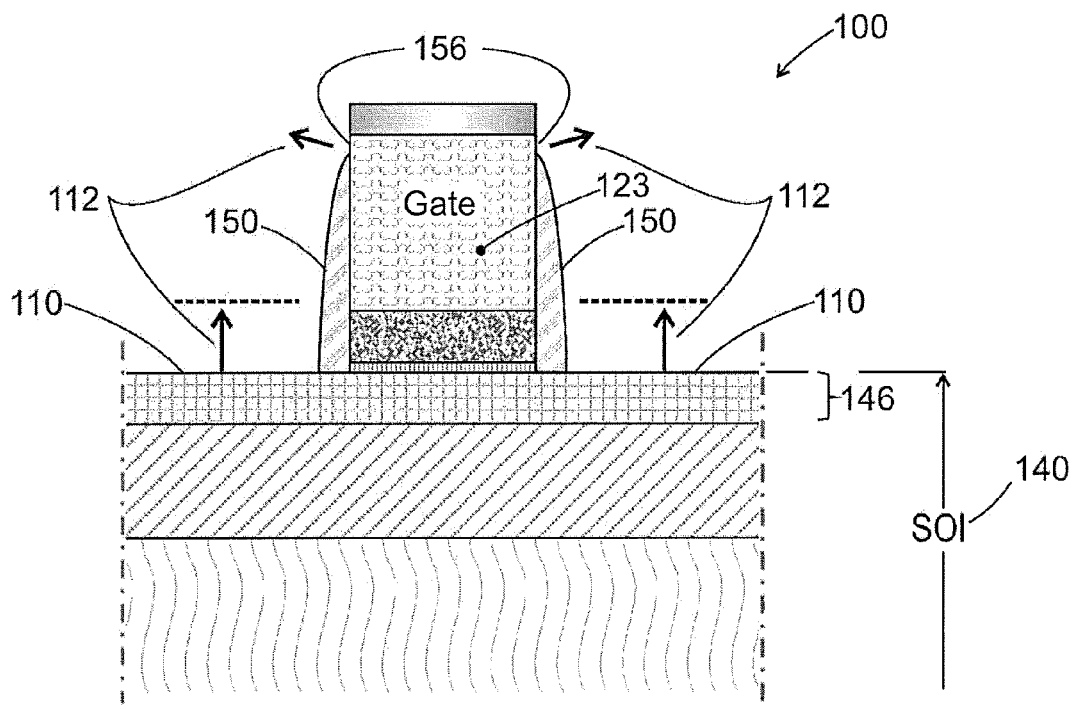

In order to prevent the problems of the conventional methods for etching spacers described in FIGS. 2a to 2c, it is necessary for the etching of the modified protective layer 158 to be the most selective possible with regards to the silicon in particular in order to not attack the silicon of the active layer 146. For example, in this embodiment of wet etching, there is no consumption of silicon of the active layer 146 due to the use of the etching solution with a hydrofluoric acid (HF) base.

As mentioned hereinabove, the thickness of the modified protective layer 158 is typically between a range of values from 1 nm to several tens of nm. The etching times can range from a few seconds to a few minutes by obviously depending directly on the thickness that was modified.

As an example wherein the modified protective layer 158 is a modified layer of nitride, in order to remove a modified thickness between 5 nm and 20 nm of modified nitride, about 30 seconds are needed with a 1% hydrofluoric acid (HF) solution. The sale etching time is obtained with phosphoric acid (H3PO4) diluted to 85%.

The stopping of said selective etching can therefore be done on the unmodified portions 152a, 152b of the protective layer 152 or/and on the monocrystalline silicon of the active layer 146 or/and on the hard mask 126 at the top of the gate 120, until the disappearance of the modified protective layer 158.

For the removal of the modified protective layer 158, recourse is preferably given to a wet etching that combines the removal of the modified protective layer 158 with a wet cleaning of the wafer containing the devices during manufacture, because after this wet etching, conventionally a wet cleaning is carried out in order to clean a wafer whereon the transistor 200 is.

Preferably, this wet etching is combined with the wet cleaning, which simplified the method and saves time.

The wet cleaning parameters are also configured in such a way that the modified protective layer 158 can be etched very selectively with respect to the species containing carbon of the carbon film 217 and to the unmodified portions (the protective spacers obtained) 152a, 152b of the protective layer 152.

Alternatively to wet etching, a dry etching of the modified protective layer 158 selectively to silicon of the active layer 146, to the material of the protective spacers 152a, 152b, to the silicon oxide ($SiO_2$) of the hard mask 126 can then also be practiced for this step of removing 440 by dry etching of the modified protective layer 158.

The embodiments for the removing via HF of a modified protective layer 158 of silicon nitride also applies in the case where the protective layer 152 is of another nature, in particular in the case where the material of the protective layer 152 has a dielectric constant that is less than that of silicon nitride, such as boron nitride (BN), SiCBN, SiOCN, SiCO, SiC.

Figure 6:
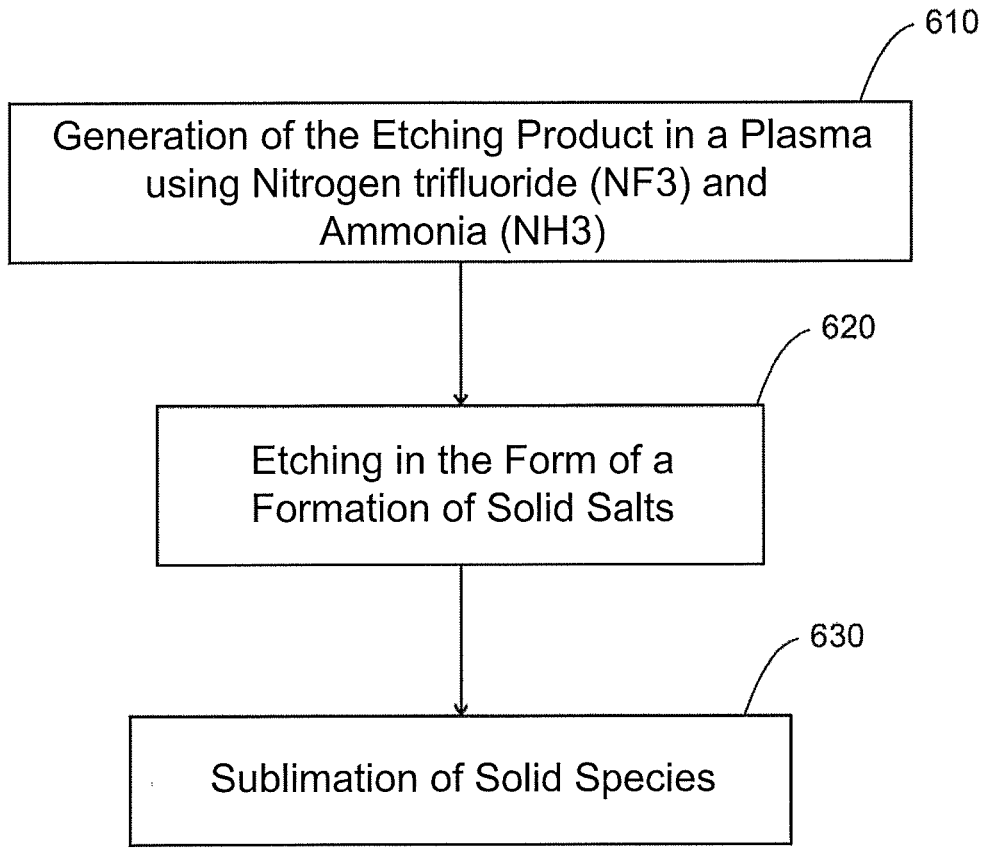
FIG. 6 shows the steps of dry removing of the modified protective layer.

In a preferred embodiment, the modified protective layer 158 is silicon nitride. The principle of the dry removing of the modified protective layer 158 comprises the following steps 610 to 630 shown in FIG. 6 that are carried out in a reaction chamber wherein a plasma is formed. The thicknesses treated are typically between 1 nm and a few tens of nanometers.

The method is that described by H. Nishini and his co-authors in a publication entitled "Damage-free selective etching of Si native oxides using NH3/NF3 and SF6/H2O down flow etching" published in the "Journal of Applied Physics" volume 74 (2), in July 1993.

The principle of dry removing of the silicon nitride layer 454 is close to that described in the publication hereinabove. The difference is that in the case of the invention silicon oxide is not etched but the modified layer 158 through the use of a plasma of the H2/CH4/Ar type for example.

The mechanism is however the same and comprises the following steps that are carried out in a reaction chamber where a plasma is formed. A first step 610 consists in generating the etching product in the plasma according to the following chemical reaction:

$NF_3 + NH_3 \rightarrow NH_4F + NH_4F \cdot HF$ which causes the nitrogen trifluoride ($NF_3$) to react with the ammonia ($NH_3$).

The etching is carried out during a second step 620, at a temperature of about 30° C. and more generally between 10° C. and 50° C., in the form of a formation of salts according to the following chemical reaction:

during an operation which lasts between a few seconds and a few minutes and which is carried out under a pressure between a few milli Torr and a few Torr. More precisely, this operation lasts between 20 seconds and 2 minutes and is carried out under a pressure between 500 milli Torr and a 3 Torr.

The solid species that are formed during this operation are then sublimated 630 at a temperature above 100° C. for several tens of seconds according to the following reaction:

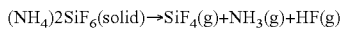

For example, to remove 10 nm of modified nitride the flows of nitrogen trifluoride ($NF_3$) and of ammonia ($NH_3$) are respectively 50 sccm and 300 sccm at 30° C. for 45 seconds for the step 620 of forming salts which is followed by the step of sublimation 630 which is carried out at 180° C. for 60 seconds.

This embodiment makes it possible to obtain a very good selectivity of the etching of the modified nitride with respect to the unmodified nitride and with the unmodified semiconductor material. In particular, this selectivity of the etching is much higher (typically by a factor of 10 at least) to that obtained with an HF solution.

At the end of the step of removing 450, there remains only the unmodified portions 152a, 152b of the initial protective layer 152 primarily on the flanks of the stack of layers that form the gate 120. The unmodified portions 152a, 152b constitute the protective spacers 152a, 152b for the gate 120 of the transistor 200 for example of the FDSOI type. In addition, the etching of the modified protective layer 158 can also be carried out for the carrying out of the spacers of a three-dimensional transistor of the FinFET type.

The result of FIG. 4e can be the result of a single step of modifying and of a single step of removing or of a plurality of sequences comprising these steps. Indeed, the operations of modifying 440 the protective layer 152 and of removing 450 of the modified protective layer 158 can optionally be repeated 460. The sequences each comprising a step of removing 430 and/or a step of modifying 440 and a step of removing 450 are carried out until complete removal of the modified material (modified nitride for example) of the modified protective layer 158. The number of sequences is calculated according to the etching speed of the first sequence.

In the example shown, the residual portions 217a, 217b of the carbon film 217 are retained. According to an alternative embodiment they are removed. For this purpose the techniques described hereinabove concerning the step 430 of removing portions of the carbon film 217 shall be used. In this case for removing the carbon film 217 on the flanks a plasma without bias can be used. In order to not damage the Si or the SiGe, an O2 or N2/H2 type plasma can be used.

Additional steps can for example be standard steps where the extensions of the source/drain zones are possibly carried out by ionic implantation of dopants with epitaxial growth of the raised source/drain of FDSOI transistors.

According to a particular embodiment, it is noted that the method of the invention can optionally include, after the step of forming 410 the protective layer 152 and prior to the step of forming 420 a carbon film 217, an anisotropic etching 320 of the protective layer 152. This is typically carried out in a plasma of the CH3F/O2/He type described previously. The etching of the spacers is such, according to this optional and non-limiting embodiment, carried out in two steps comprising: a first step referred to a "main etching" carried out isotropically and a second finishing step generally referred to as "over etching" (OE). It is during the step of over etching (steps 450) the removing of the material remaining on the horizontal surfaces is finished, after having modified (step 440) the protective layer 152 in order to prevent or limit the problems described in FIGS. 2a to 2c.

In the framework of the implementation of the invention, it can be decided to maintain or not the step of anisotropic etching 320, the following steps then apply either on the protective layer 152 such as deposited or on the remaining protective layer 152 after a main etching has been carried out beforehand as in the standard method for etching spacers.

The step of anisotropic etching 320 makes it possible to quickly remove a high thickness of nitride via isotropic etching then to control with precision the thickness of the spacers by carrying out the steps 440 and 450.

This step 320 can be applied to all of the alternatives of the invention, in particular those that shall be described in what follows.

An alternative embodiment according to the invention shall now be described in detail in reference to FIGS. 4a to 4c, 5, 4d and 4e.

The starting structure of the transistor 200 according to this alternative embodiment is similar to that of the transistor 200 such as shown in FIG. 4a.

The step of forming 410 a protective layer 152 is not different from that shown hereinabove in reference to the embodiment described in FIG. 4b.

The detailed description of the starting structure of the transistor 200 and of the step of forming 410 is consequently omitted in order to avoid a redundant description.

The following step to be carried out is the step of forming 420 a carbon film 217. The step 420 is not different from that shown hereinabove in reference to the embodiment described in FIG. 4c.

One of the main differences between the embodiment described in FIGS. 4a to 4e and this alternative embodiment resides in the steps of removing 430 of portions of the carbon film 217 and of modifying 440 the protective layer 152. The step 430 and 440 of the embodiment described in FIGS. 4a to 4e are carried out simultaneously which according to this other embodiment, the step of removing 430 of portions of the carbon film is carried out prior to the step of modifying 440 of the protective layer 152.

Figure 5:
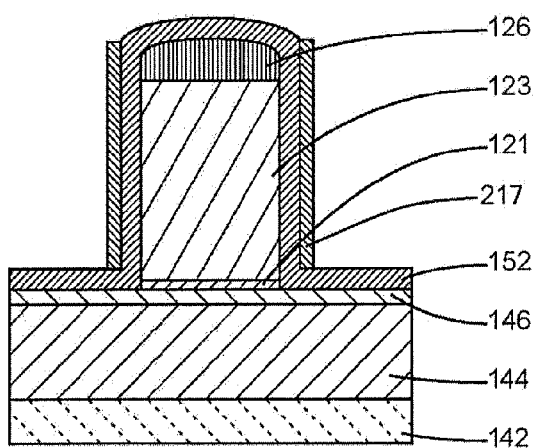

FIG. 5 shows the structure of the transistor 200 obtained after the step of removing 430 according to this alternative embodiment.

According to this embodiment, the step of removing 430 is a single step carried out to remove, preferentially anisotropically, the carbon film 217 in all of its thickness on all of the surfaces parallel to the plane of the substrate 140 whereon the gate 120 of the transistor 200 rests by retaining residual portions 217a, 217b on the flanks of the gate 120. As such the portions of the carbon film 217 located on the top of the gate 120 and on either side of the gate 120 are removed.

The type of plasma used and the conditions for carrying out the implementation of this step of removing 430 are similar to those of the step 430 of the embodiment shown hereinabove in FIGS. 4a to 4e. The function "a" such as described hereinabove is therefore fulfilled.

Preferentially, the protective layer 152 is not modified during this step of removal 430. In order to remove the carbon film 217 without modifying the protective layer 152, ions such as Ar, N2, He can be used. Note that for He there is a risk of modifying the layer 152 as the depth of implantation is greater than with argon Ar for example for the same ionic energy. In many applications, it is not a hindrance to partially modify the protective layer 152, as long as the underlying layer, typically Si or SiGe, is not modified.

As such, at the end of the step of removing 430 the horizontal portions of the carbon film 217, there remains only the residual portions 217a, 217b of the carbon film 217 that cover only the surfaces perpendicular to the plane of the substrate 140 (i.e. parallel to the direction of implantation of the plasma during the step 430), for example on the flanks of the gate 120.

These residual portions 217a, 217b, used as carbon spacers, have a thickness that is preferably very thin, for example between 1 and 5 nm, preferably 1 nm.

As in the embodiment shown hereinabove in FIGS. 4a to 4e, the carbon film 217 is no longer present on the surfaces perpendicular to the direction of bombardment, with the bombardment of ions being carried out anisotropically as mentioned hereinabove.

Then, the step of modifying 440 is carried out in order to modify, preferentially anisotropically, the protective layer 152 over all of the surfaces parallel to the plane of the substrate 140 whereon the gate 120 of the transistor 200 rests by retaining unmodified portions 152a, 152b covering the flanks of the gate 120, as shown in FIG. 4d.

The type of plasma used and the conditions for carrying out the implementation of this step of modifying 440 of the protective layer 152 are similar to those of the step 440 of the embodiment shown hereinabove in FIGS. 4a to 4e. The function "b" such as described hereinabove is therefore fulfilled.

As such, at the end of this step of modifying 440 of the protective layer 152, there remains only the unmodified portions 152a, 152b of the protective layer 152 covering only the surfaces perpendicular to the plane of the substrate 140, for example on the flanks of the gate 120.

These unmodified portions 152a, 152b, used as protective spacers, have a thickness that is preferably thin, for example between 1 and 30 nm, preferably 10 nm.

As in the embodiment shown hereinabove in FIGS. 4a to 4e, preferentially all of the thickness of the protective layer 152 on the surfaces perpendicular to the direction of bombardment of H2 and/or He ions is modified.

Then, the step of removing 450 is carried out in order to remove, the modified protective layer 158, as shown in FIG. 4e. This step of removing 450 is carried out via selective etching to the unmodified portions 152a, 152b of the protective layer 152 and to the semi-conductor material of the active layer 146. Preferably this etching etches the modified protective layer 158 selectively to the carbon spacers 217a, 217b and/or to the silicon oxide (SiO$_2$) of the hard mask 126 at the top of the gate 120. This step of removing 450 can be combined with a standard step of cleaning in order to simplify the method, which makes it possible to save time.

The type of selective etching and the conditions for carrying out the implementation of this step of removing 450 are similar to those of the step 450 of the embodiment shown hereinabove in FIGS. 4a to 4e.

In addition, according to this alternative embodiment, the result of FIG. 4e can be the result of a single step of modifying 440 and of a single step of removing 450 or of a plurality of sequences comprising these steps.

Indeed, the operations of modifying 440 the protective layer 152 and of removing 450 of the modified protective layer 158 can optionally be repeated 460. For some applications it is necessary to have very precise control of the "faceting", i.e. of the problem mentioned in FIG. 2c, which results from the operations of conventional etching and which can therefore be induced by the step of main etching 320 which is optional as has been seen. Advantageously, in order to overcome this problem, this step will be therefore be avoided and replaced with a repetition 460 of the operations of modifying 440 the protective layer 152 and of removing 450 the modified protective layer 158, with the removing carried out preferably in this case in the form of a dry removal as described in FIG. 6 since, as was noted hereinabove, the two operations can be practiced in the same etching reactor. This embodiment can apply to each one of the alternative implementations of the invention.

The sequences each comprising a step of modifying 440 the protective layer 152 and a step of removing 450 are carried out until complete removal of the modified material (modified nitride for example) of the modified protective layer 158. The number of sequences is calculated according to the etching speed of the first sequence.

Figure 7:
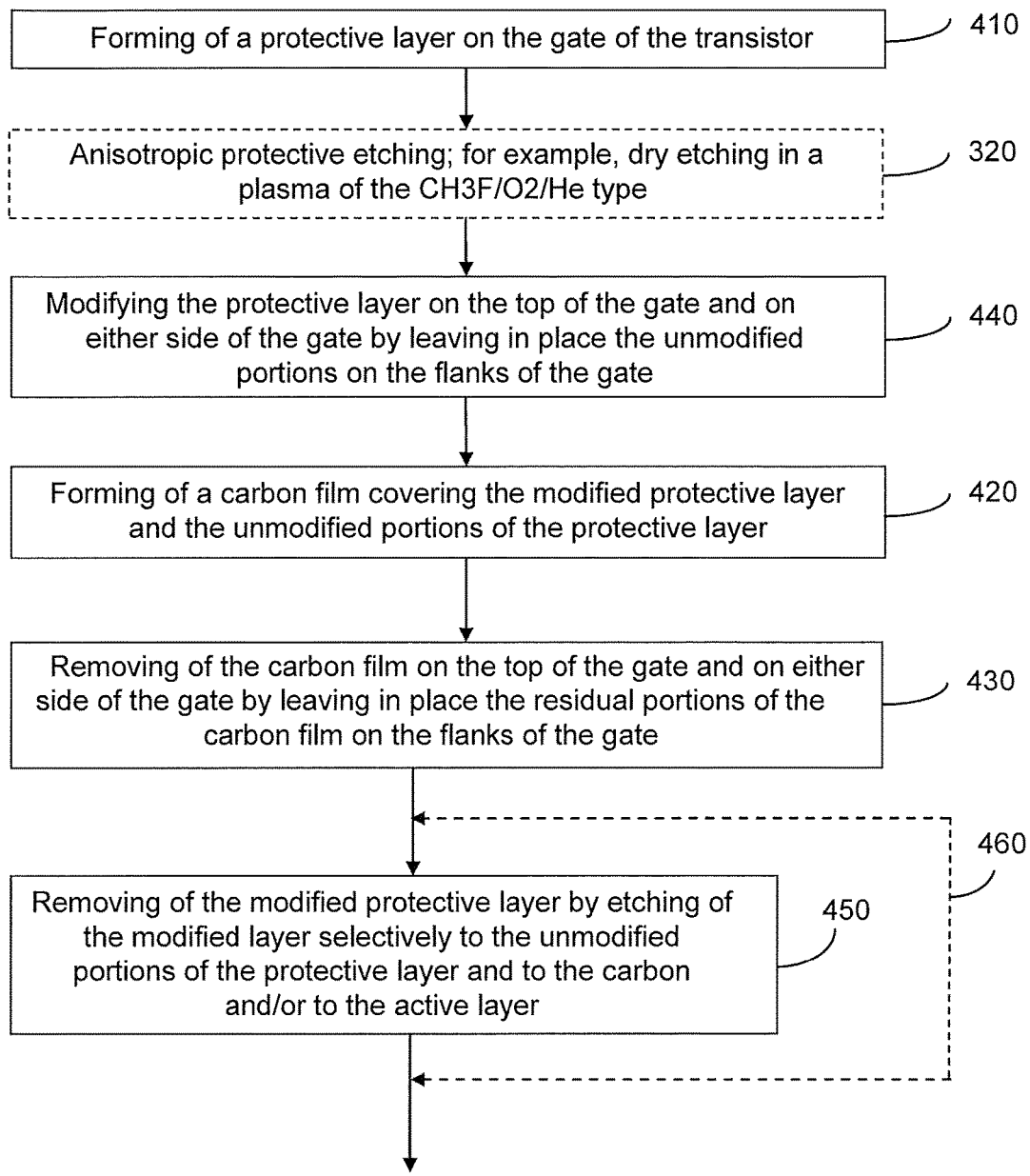
FIG. 7 summarizes the main steps of an alternative example of the method of forming spacers of a transistor according to the invention.

Another embodiment of the invention is shown in FIGS. 8a to 8f. FIG. 7 summarizes the main steps 410 to 450 of this alternative embodiment.

In this embodiment, the protective layer 152 outside of the flanks is modified before depositing the carbon film 217 then removing the latter outside of the flanks. It is only after that removing of the modified protective layer 158 is carried out.

This embodiment has for advantage to allow for an implantation as close as possible to the gate. The modified thickness of the protective layer 152 is therefore controlled with more precision. In the end this embodiment makes it possible to respond with great effectiveness to the problem consisting in improving the precision of the forming of the spacers of the gate.

Figure 8A:
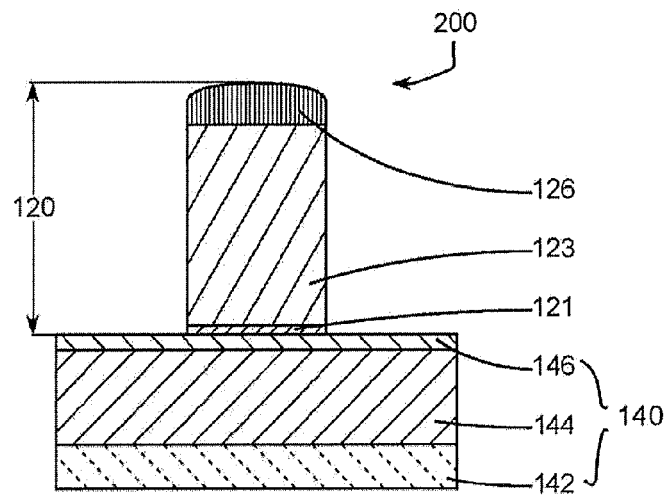
FIGS. 8a to 8f respectively show a structure of a transistor obtained after one of the steps of a method according to another alternative embodiment of the invention different from the two embodiments shown hereinabove.
Figure 8B:
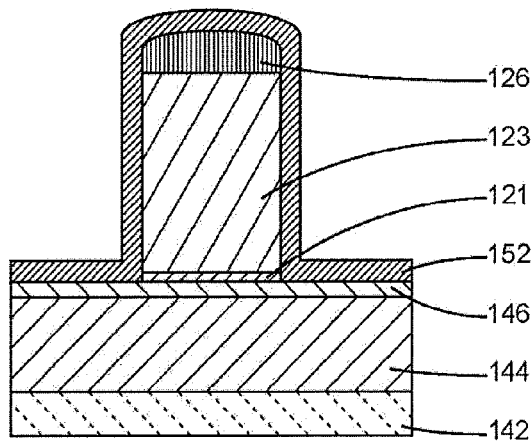

As with the two preceding embodiments, this alternative embodiment begins with a step of forming 410 a protective layer 152 covering a transistor 200, as shown in FIGS. 8a and 8b.

Figure 8C:
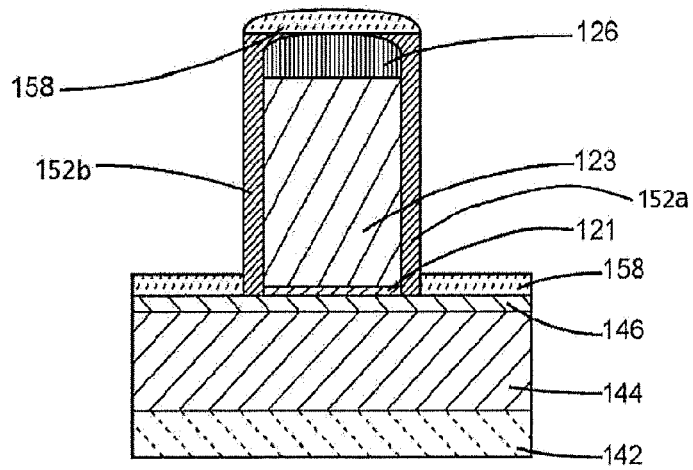

FIG. 8c shows the structure of the transistor 200 obtained after the step of modifying 440 of the protective layer 152. Note that contrary to the other embodiments, the step of modifying 440 of the protective layer 152 is carried out before the step of forming 420 of the carbon film 217.

This step of modifying 440 can be carried out according to the explanations given for the embodiment shown hereinabove in FIGS. 4a to 4c, 5, 4d and 4e or for the one shown hereinabove in FIGS. 4a to 4e.

Figure 8D:
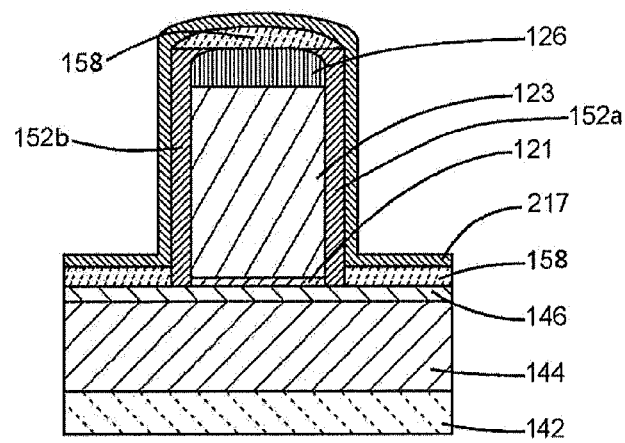
Figure 8E:
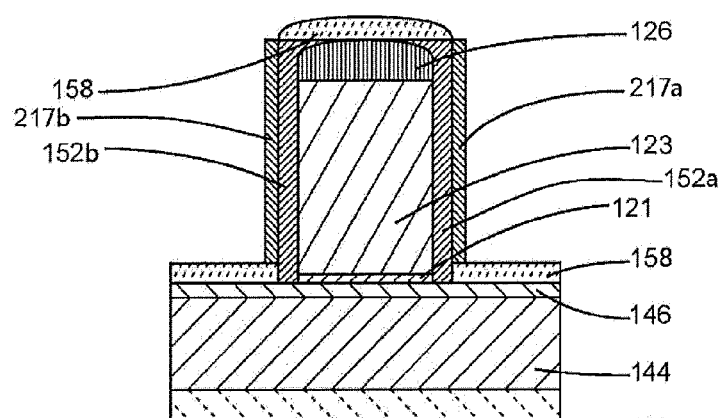

A step of forming 420 a carbon film 217 and the step of removing 430 of the carbon film 217 are then carried out, as shown in FIGS. 8d and 8e. According to this alternative embodiment, the carbon film 217 is deposited directly in contact with surfaces of the structures during manufacture; i.e. the carbon film 217 is deposited directly in contact with the modified protective layer 158 and with the unmodified portions 152a, 152b of the protective layer 152. As such the carbon film is no longer in direct contact with the active layer.

The carbon film 217 is then removed in particular on the top of the gate and on either side of the gate in such a way as to leave in place all or a portion of the carbon film on the flanks of the gate as shown in FIG. 8e.

The steps 420 and 430 can be executed as those of the embodiment described in reference to FIGS. 4a to 4c, 5, 4d and 4e and such as those of the embodiment described in FIGS. 4a to 4e.

Figure 8F:
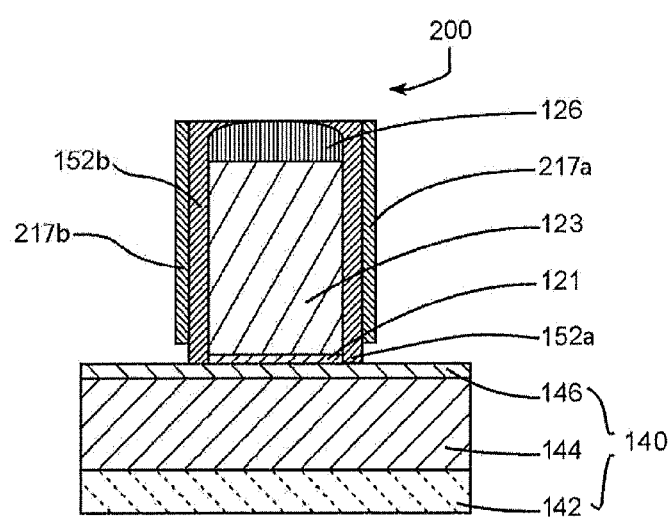

Then, the step of removing 450 is, as described hereinabove, carried out in order to remove, preferentially anisotropically, the modified protective layer 158, as shown in FIG. 8f. This step of modifying 450 can be carried out in the same way as those described in referenced to the embodiment shown hereinabove in FIGS. 4a to 4c, 5, 4d and 4e or to the one shown hereinabove in FIGS. 4a to 4e.

The result of FIG. 8f can be the result of a single step of modifying 450 or of a plurality of sequences comprising this step 450.

According to this alternative embodiment, the operations of removing 450 the modified protective layer 158, can optionally be repeated 460 until the complete removal of the modified material (modified nitride for example) of the modified protective layer 158, in order to overcome the problem that can be induced by the main step of etching 320, as described hereinabove and shown in FIG. 2c. The number of sequences is calculated according to the etching speed of the first sequence. The removal is done preferably in this case in the form of a dry removal as described in FIG. 6 since, as was noted hereinabove, the two operations can be practiced in the same etching reactor.

In the preceding description, many advantages conferred by the invention are revealed. The method of the invention allows for in particular an anisotropic modification carried out very selectively to carbon and to the unmodified material (for example the unmodified nitride) that constituted carbon spacers and protective spacers for the gate and to a semiconductor material such as silicon.

The method of the invention is particular advantageous for forming the spacers of transistors of the MOSFET or FinFET type.

The method of this invention makes it possible to very precisely control the dimension of the spacers while still overcoming or reducing the problems detailed hereinabove, for example: the excessive consumption of silicon of the active layer, the forming of feet on the spacers of the gate at the interface with the SOI substrate such as described in FIGS. 1b and 1c as well as the erosion of the spacers of the gate such as described in FIG. 1d.

The invention is not limited to only the embodiments and examples described hereinabove, but extends to all the embodiments that fall within the scope of the claims.

The invention claimed is:

1. A method for forming spacers of a gate of a field-effect transistor, with the gate having a top and flanks and being located above an active layer in a semiconductor material, comprising:
   forming a protective layer covering the gate, with the protective layer having a dielectric constant that is less than or equal to 8;
   after the forming the protective layer, at least one step of forming a carbon film on the transistor;
   after the forming the carbon film, at least one step of removing the carbon film on a top of the gate and on either side of the gate by putting the carbon film into presence with a plasma, creating a bombardment of ions that are heavier than hydrogen ions according to a main direction so as to remove at least portions of the carbon film located on the top and on either side of the gate and which are perpendicular to said main direction, and leaving in place residual portions of the carbon film on the flanks of the gate;
   at least one step of modifying the protective layer by putting the protective layer into presence with a plasma containing ions with a hydrogen base (H, $H^+$, $H_2^+$, $H_3^+$, etc.) and/or with a helium base, creating a bombardment of ions with the hydrogen base and/or with the helium base anisotropically according to said main direction that is parallel to the flanks of the gate, said bombardment modifying at least portions of the protective layer that are located on the top and on either side of the gate and which are perpendicular to the flanks of the gate by retaining unmodified portions of the protective layer covering the flanks of the gate; and
   after the modifying the protective layer, the forming the carbon film, and the removing at least the portions of the carbon film leaving in place residual portions of the carbon film on the flanks of the gate, performing at least one step of removing the modified protective layer using a selective etching of the modified protective layer with respect to the unmodified portions of the protective layer and with respect to the residual portions of the carbon film,
   wherein the forming the carbon film and the modifying the protective layer are not carried out simultaneously.

2. The method according to claim 1, wherein the protective layer is a layer with a nitride base or a layer of material having a dielectric constant less than or equal to that of silicon nitride.

3. The method according to claim 1, wherein the forming the carbon film is performed using a plasma with a $C_xH_yF_z$, $C_xH_y$, or $C_xF_y$ base, where x is the proportion of carbon, and y and/or z are respectively the proportion of hydrogen and/or fluorine.

4. The method according to claim 3, wherein the $C_xH_y$ is $CH_4$.

5. The method according to claim 1, wherein the forming the carbon film is performed by using an inductively-coupled plasma (ICP) or a capacitive-coupled plasma (CCP).

6. The method according to claim 1, wherein the plasma used during the removing the portions of the carbon film comprises ions that are heavier than hydrogen, said bombardment of the ions heavier than hydrogen removing at least portions of the carbon film located on the top and on either side of the gate by leaving in place residual portions of the carbon film on the flanks of the gate.

7. The method according to claim 1, wherein the plasma used during the removing the portions of the carbon film comprises ions taken from argon, helium, nitrogen, and oxygen.

8. The method according to claim 1,
   wherein, during the modifying, the conditions of the plasma, including the concentration, the energy of the ions with a hydrogen base and/or a helium base, and the main direction of implantation of these ions are chosen so that on the surfaces perpendicular to the main direction, an entire thickness of the protective layer is modified by the implantation of said ions of the plasma during the modifying, and
   wherein the removing is performed so as to remove an entire modified protective layer, thereby exposing the active layer on the surfaces perpendicular to said main direction.

9. The method according to claim 1, wherein the protective layer is taken from: a layer with a silicon nitride base, a layer of silicon nitride, boron nitride (BN), SiCBN, SiOCN, SiCO, and SiC.

10. The method according to claim 1, wherein the removing the modified protective layer is performed by wet etching.

11. The method according to claim 1,
wherein the semiconductor material is silicon, and
wherein the removing the modified protective layer is performed by selective wet etching of said semiconductor material of the active layer and/or of a layer of silicon oxide (SiO$_2$) overlaying the gate.

12. The method according to claim 1,
wherein the removing is performed by selective dry etching of said modified layer with respect to said carbon film, with respect to unmodified portions of the protective layer, and with respect to said semiconductor layer, and
wherein the selective dry etching comprises:
a step of etching consisting in formation of solid salts, and
a step of sublimation of solid species.

13. The method according to claim 1, further comprising several sequences each comprising a step of modifying the protective layer and a step of removing, and during at least one of the steps of modifying, only a portion of the thickness of the protective layer is modified.

14. The method according to claim 1, wherein the modifying is a single step performed to modify the protective layer in all of a thickness thereof over all of the surfaces parallel to a plane of a substrate whereon the gate rests, and to not modify the protective layer in all of a thickness thereof on surfaces perpendicular to the plane.

15. The method according to claim 1, wherein the removing the portions of the carbon film and the modifying are performed simultaneously.

16. The method according to claim 15, wherein the removing the portions of the carbon film and the modifying the protective layer are performed simultaneously and by using the same plasma comprising hydrogen and/or helium ions.

17. The method according to claim 16, wherein the plasma further comprises ions taken from argon, helium, nitrogen, and/or oxygen.

18. The method according to claim 1, wherein the modifying the protective layer is performed after the forming the carbon film and after the removing the portions of the carbon film.

19. The method according to claim 1, wherein the modifying the protective layer is performed prior to the forming the carbon film.

20. The method according to claim 19, wherein the modifying the protective layer is preceded by anisotropic etching that is carried out in a plasma of a CH$_3$F/O$_2$/He type.

* * * * *